(12) United States Patent
Chan et al.

(10) Patent No.: US 11,605,586 B2
(45) Date of Patent: Mar. 14, 2023

(54) AIRBRIDGE FOR MAKING CONNECTIONS ON SUPERCONDUCTING CHIP, AND METHOD FOR PRODUCING SUPERCONDUCTING CHIPS WITH AIRBRIDGES

(71) Applicant: IQM Finland Oy, Espoo (FI)

(72) Inventors: Kok Wai Chan, Espoo (FI); Tianyi Li, Espoo (FI); Wei Liu, Espoo (FI); Caspar Ockeloen-Korppi, Espoo (FI)

(73) Assignee: IQM Finland Oy, Espoo (FI)

( * ) Notice: Subject to any disclaimer, the term of this patent is extended or adjusted under 35 U.S.C. 154(b) by 74 days.

(21) Appl. No.: 16/932,350

(22) Filed: Jul. 17, 2020

(65) Prior Publication Data

US 2021/0265261 A1    Aug. 26, 2021

(30) Foreign Application Priority Data

Feb. 21, 2020  (EP) ..................... 20158816

(51) Int. Cl.
| | |
|---|---|
| H01L 27/18 | (2006.01) |
| H01L 23/522 | (2006.01) |
| H01L 21/768 | (2006.01) |
| H01L 23/532 | (2006.01) |

(52) U.S. Cl.
CPC .... *H01L 23/5221* (2013.01); *H01L 21/76885* (2013.01); *H01L 23/5329* (2013.01); *H01L 23/53285* (2013.01); *H01L 27/18* (2013.01)

(58) Field of Classification Search
CPC ................. H01L 27/18; H01L 39/08
See application file for complete search history.

(56) References Cited

U.S. PATENT DOCUMENTS

| | | |
|---|---|---|
| 2019/0188597 A1 | 6/2019 | Chen et al. |
| 2020/0052359 A1 | 2/2020 | Painter et al. |

(Continued)

FOREIGN PATENT DOCUMENTS

| | | |
|---|---|---|
| CN | 109607474 | 4/2019 |
| CN | 212323238 | 1/2021 |

(Continued)

OTHER PUBLICATIONS

Extended European Search Report issued in EP20158816.7, dated Jul. 28, 2020, 9 pages.

(Continued)

*Primary Examiner* — Jae Lee
(74) *Attorney, Agent, or Firm* — K&L Gates LLP

(57) ABSTRACT

An airbridge implements connections on a superconducting chip. It comprises a strip of superconductive material between a first superconductive area and a second superconductive area. A first end of said strip comprises a first planar end portion attached to and parallel with said first superconductive area, and a second end of said strip comprises a respective second planar end portion. A middle portion is located between said first and second planar end portions, forming a bend away from a plane defined by the surfaces of the first and second superconductive areas. First and second separation lines separate the end portions from the middle portion. At least one of said first and second separation lines is directed otherwise than transversally across said strip.

20 Claims, 4 Drawing Sheets

(56) References Cited

U.S. PATENT DOCUMENTS

2021/0217947 A1* 7/2021 Adiga .................... H01L 39/12
2021/0272814 A1* 9/2021 Peter .................. H01L 21/3065

FOREIGN PATENT DOCUMENTS

EP          1986232      10/2008
WO          2019045762    3/2019

OTHER PUBLICATIONS

International Search Report issued to PCT/FI2021/050116, dated May 17, 2021, 6 pages.

Dunsworth, A. et al., "A method for building low loss multi-layer wiring for superconducting microwave devices"; arXiv.org, Cornell University Library [online] Feb. 28, 2018, pp. 1-10, [retrieved on Apr. 28, 2021]. Retrieved from <https://arxiv.org/abs/1712.01671v2>.

Lankwarden, Y. J. Y. et al., Development of NbTiN—Al Direct Antenna Coupled Kinetic Inductance Detectors:; Journal of Low Temperature Physics Jan. 20, 2012, vol. 167, pp. 367-372, <DOI:10,1007/s10909-012-0503-0>.

Wang, T.-J. et al., "On-Chip Optical Microresonators With High Electro-Optic Tuning Efficiency"; Journal of Lightwave Technology Dec. 12, 2019, vol. 38, No. 7, pp. 1851-1857, <DOI:10.1109/JIT.2019.2959345>.

Chen, Z. et al., "Fabrication and characterization of aluminum airbridges for superconducting microwave circuits"; Applied Physics Letters Feb. 3, 2014, vol. 104, 052602, <DOI:10.1063/1.4863745>.

Khalid, A. et al., "Simple e-beam air-bridge technology for mm-wave applications"; Microelectronic Engineering Jun. 27, 2012, vol. 98, pp. 262-265, <DOI:10.1016/j.mee.2012.06.006>.

Jie, S. et al., "A Lithographic Resist-Based Simple Technology for High Yield Microfabrication of Air Bridges"; Journal of Microelectromechanical Systems Oct. 18, 2012, vol. 21, No. 6, pp. 1285-1287, <DOI:10.1109/ JMEMS.2012.2222018>.

Borzenko, T., "Building and testing submicrometer metallic (gold) air-bridges for nanotransport applications'" Microelectronic Engineering Jan. 11, 2005, vols. 78-79, pp. 374-380, <DOI:10.1016/j.mee.2004.12.050>.

* cited by examiner

AIRBRIDGE FOR MAKING CONNECTIONS ON SUPERCONDUCTING CHIP, AND METHOD FOR PRODUCING SUPERCONDUCTING CHIPS WITH AIRBRIDGES

PRIORITY CLAIM

This application claims priority to European Patent Application No. 20158816.7, filed on Feb. 21, 2020, the entire disclosure of which is incorporated by reference herein.

TECHNICAL FIELD

The invention is generally related to the technology of superconducting chip hardware. In particular the invention is related to making electrically (super) conductive contacts between conductive areas on a chip.

BACKGROUND

Superconducting chips are used in various applications such as quantum computing. Very high frequencies of electric signals are often involved, generally on the order of several GHz, which makes it important to have good and extensive ground planes on the chip. The ground planes appear as relatively large, essentially continuous patches or areas of conductive material on one or more surfaces of a substrate. Adjacent ground planes may be separated from each other by signal transmission lines or other discontinuities, which makes it uncertain whether the electric potential of the ground planes on both sides of the discontinuity is really the same. The discontinuities may give rise to unwanted phenomena such as the so-called slot line modes in the ground planes.

In addition to ground planes, there may be also other locations on the superconducting chip where a robust electrical connection must be ensured between two conductive areas that are separated from each other by a discontinuity on the surface of the chip. Examples of such other locations include places where a signal-conducting transmission line crosses a resonator or another signal-conducting transmission line, or where a certain point of a resonator or signal-conducting transmission line is locally connected to ground.

The conventional way of making electrical connections over a separating discontinuity is wire bonding. A wire bonding machine uses heat and/or ultrasonic energy to form a metallurgical weld between an end of a fine metal wire and a first conductive area. The wire is run through the surrounding free space to a second conductive area, where a similar attachment is made before cutting the loose end of the wire.

While wire bonding is a well-known and widely used technology, it has disadvantages particularly when miniaturization and high immunity to noise and interference are desired. It is not uncommon for a quantum computing chip with six individual qubits to have over 150 bond wires. Designers of quantum computing chips are currently aiming to increase the number of qubits on a chip, which is expected to increase the number of required connections between adjacent conductive areas even further. Although a number of the bond wires may run between conductive areas at the edge of the chip and an adjacent conductive area on a circuit board to which the chip is attached, there will be a significant number of also on-chip locations where the disadvantages of wire bonding become an issue.

SUMMARY

It is an objective to provide a structural solution for making electrically conductive connections between adjacent conductive areas on a superconducting chip in scalable architectures. Another objective is that the structural solution reserves only a small space or area on the chip. A further objective is to make the manufacturing of such electrically conductive connections easy and reliable. A yet further objective is to make such electrically conductive connections as lossless and as immune to noise and interference effects as possible.

The objectives of the invention are achieved by utilizing thin film deposition methods to make microscopically small, strip-like airbridges across the discontinuities. Ends of the suspended portion of the airbridge can be made to differ from a rectilinearly delimited shape to improve structural stability.

According to a first aspect, there is provided an airbridge for making connections on a superconducting chip. The airbridge comprises a strip of superconductive material between a first superconductive area and a second superconductive area, which is separated from said first superconductive area by a discontinuity. A first end of said strip comprises a first planar end portion attached to and parallel with said first superconductive area, and a second end of said strip comprises a second planar end portion attached to and parallel with said second superconductive area. Said strip comprises a middle portion between said first and second planar end portions. Said middle portion forms a bend away from a plane defined by the surfaces of the first and second superconductive areas, leaving an empty space between said middle portion and said plane. A first separation line separates the first planar end portion from the middle portion, and a second separation line separates the second planar end portion from the middle portion. At least one of said first and second separation lines is directed otherwise than transversally across said strip.

According to an embodiment, the strip is limited by two longitudinal edges between said first end and said second end, and the length of said middle portion from said first separation line to said second separation line along a middle line between said two longitudinal edges is different than the length of said middle portion along any of the two longitudinal edges. This provides an advantage where the middle portion can be made to exhibit curvature in at least two different directions by using relatively simple methods of manufacturing.

According to an embodiment, both ends of the first separation line are closer to the first end of the strip than a middle point of the first separation line, and both ends of the second separation line are closer to the second end of the strip than a middle point of the second separation line. The length of said middle portion from said first separation line to said second separation line along said middle line between said two longitudinal edges is then shorter than the length of said middle portion along any of the two longitudinal edges. This provides an advantage where the middle portion can be made to exhibit curvature in at least two different directions by using relatively simple methods of manufacturing.

According to an embodiment, the strip of superconductive material comprises at least two material layers on top of each other, wherein said material layers have been deposited with different thin film deposition methods. This provides an advantage where the airbridge can be made to exhibit high structural strength and other advantageous structural properties.

According to an embodiment said middle portion has the form of a saddle surface. This provides an advantage where the inherent structural stability properties involved in saddle surfaces can be utilized.

According to an embodiment, the thickness of said strip in the direction perpendicular to said plane is at least 1 micrometer. This provides an advantage of significantly better structural strength than that of thinner airbridges.

According to an embodiment, a length of said strip from said first end to said second end is between 80 and 120 micrometers, these limits included. This provides an advantage where the airbridge structure can be made to fit in various parts of superconducting microelectronic chips.

According to an embodiment, a width of said strip in the transverse direction is between 40 and 80 micrometers, these limits included. This provides an advantage where the airbridge structure can be made to fit in various parts of superconducting microelectronic chips.

According to a second aspect there is provided superconducting chip that comprises a substrate, and on a surface of said substrate, a first superconductive area and a second superconductive area separated from said first superconductive area by a discontinuity. The superconducting chip comprises an airbridge of the kind described above between said first superconductive area and said second superconductive area.

According to an embodiment, the superconducting chip comprises a circuit element located in said discontinuity between said first and second superconductive areas. Said circuit element can be, for example, a transmission line between further circuit elements, resonator, a DC flux line, a DC voltage bias line, an RF line such as control bus, or a capacitive coupler line. This provides an advantage where relatively limitless possibilities exist for placing circuit elements on the superconducting chip without having to worry about how the electrically conductive connections are made between superconductive areas that are separated from each other by such circuit elements.

According to a third aspect there is provided a method for producing a superconductive connection across a discontinuity between a first superconductive area and a second superconductive area of a superconducting chip. The method comprises using one or more thin film deposition methods to form a strip of superconductive material on top of said first and second superconductive areas and across said discontinuity. A first end of said strip is made to comprise a first planar end portion attached to and parallel with said first superconductive area, and a second end of said strip is made to comprise a second planar end portion attached to and parallel with said second superconductive area. Said strip is made to comprise a middle portion between said first and second planar end portions. Said middle portion is made to form a bend away from a plane defined by the surfaces of the first and second superconductive areas, leaving an empty space between said middle portion and said plane. At least one of said first and second planar end portions is formed so that a respective separation line that separates that planar end portion from the middle portion is directed otherwise than transversally across said strip.

According to an embodiment, one of said one or more thin film deposition methods is sputtering. This provides an advantage where material layers of considerable thickness can be produced relatively fast.

According to an embodiment, the method comprises removing oxide from surfaces of said first and second superconductive area at locations at which said strip is to be attached to said first and second superconductive areas respectively, and using a first thin film deposition method to deposit a first layer of material at said locations. Said removing of oxide can be performed in-situ in a vacuum environment, and said use of the first thin film deposition method to deposit said first layer of material at said locations can be performed without compromising the vacuum of said vacuum environment. This provides an advantage where very good electrically conductive connections can be produced without having to worry about any intermediate oxidization that could cause undesired loss of conductivity.

According to an embodiment, said removing of the oxide is performed using ion milling, and said deposition of the first layer of material at said locations is performed using an electron beam evaporation. This provides an advantage where these method steps can be combined and performed in the same apparatus, as long as it comprises the required capabilities of both procedures.

According to an embodiment, the method comprises, after said deposition of material at said locations using the first thin film deposition method, using a second, different thin film deposition method to deposit a second layer of material on top of the first layer. This provides an advantage where a bulk of the material layer(s) can be produced relatively fast, even if the faster deposition method would be suboptimal for depositing the very first material layer(s).

According to an embodiment, at least one of said first and second planar end portions is formed so that the length of said middle portion from said first separation line to said second separation line along a middle line between longitudinal edges of the strip is different than the length of said middle portion along any of the two longitudinal edges. This provides an advantage where the middle portion can be made to exhibit curvature in at least two different directions by using relatively simple methods of manufacturing.

BRIEF DESCRIPTION OF THE DRAWINGS

The accompanying drawings, which are included to provide a further understanding of the invention and constitute a part of this specification, illustrate embodiments of the invention, and together with the description help to explain the principles of the invention. In the drawings.

DETAILED DESCRIPTION

Figure 1:
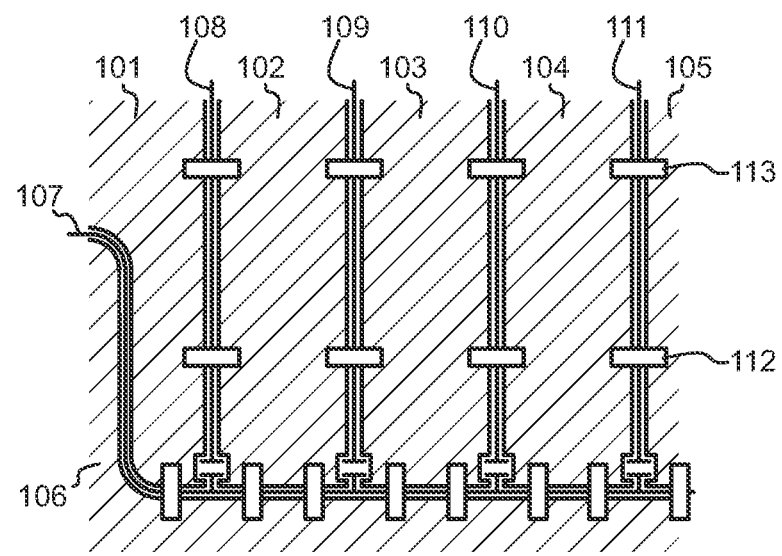
FIG. 1 illustrates an example of airbridges between conductive areas on a surface of a superconducting chip.

FIG. 1 is a top view of a part of a superconducting chip. Represented by oblique hatching in the drawing are relatively extensive superconductive areas, the reference numbers of which are 101 to 106. These areas may be, for example, parts of a ground plane or other extensive structure of fixed potential in the superconducting chip. A superconductive area includes a two-dimensional surface area made of, covered with, and/or having an intermediate layer of material that is capable of becoming superconductive at temperatures at which the chip is meant to be used. Assuming that the chip is meant to be used as a part of a quantum computing device, it may be used in temperatures well below 1 K. Materials that can be used to form superconductive areas on chips include but are not limited to aluminum, niobium, tantalum, titanium, and superconductive alloys of these.

Discontinuities in the superconductive material separate adjacent superconductive areas from each other in the chip a part of which is shown in FIG. 1. Circuit elements may be located in said discontinuities; examples of such circuit elements in FIG. 1 are a transmission line 107 between further circuit elements (which as such are not shown in FIG. 1) as well as four resonators 108 to 111. Further examples of such circuit elements include DC flux lines, DC voltage bias lines, RF lines such as control buses that carry microwave signals, and capacitive coupler lines.

Coupling means for providing signal couplings between the transmission line 107 and the resonators 108 to 111 are seen at the lower ends of the resonators. In this example the coupling means have the form of two oppositely directed, T-formed sections of the material of which the transmission line and the resonators are made.

Airbridges are provided for making connections between adjacent superconductive areas, across the discontinuities and the circuit elements located in the discontinuities. There are a total of 16 such airbridges shown in FIG. 1; airbridges 112 and 113 are shown as examples.

Figure 2:
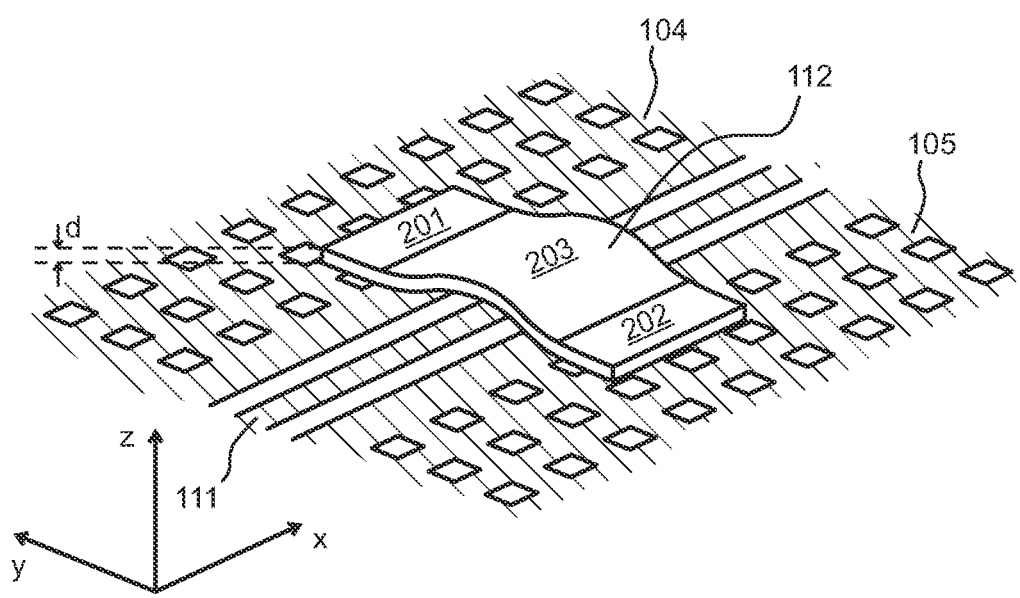
FIG. 2 illustrates an example embodiment of an airbridge.

FIG. 2 shows an enlarged axonometric view of an airbridge 112 that makes a connection between a first superconductive area 104 and a second superconductive area 105, which are separated from each other by a discontinuity. As shown in FIG. 2, the superconductive areas on the chip do not need to be completely continuous: in the example of FIG. 2 each of the first 104 and second 105 superconductive areas are shown to comprise a regular array of openings, commonly referred to as flux traps. They prevent the generation of any unwanted magnetic field that could otherwise be generated by currents passing through relatively large, continuous, conductive ground planes. The dimensions of the openings are small enough so that, at the relevant frequencies, the superconductive area in question has a grounding effect essentially like that of a continuous superconductive area. A part of the circuit element 111, which in this example is a resonator, is located in the discontinuity, as shown in FIG. 2.

The airbridge 112 comprises a strip of superconductive material between the first 104 and second 105 superconductive areas. The word strip refers to the general outline of the piece of material that constitutes the airbridge 112: it is somewhat elongated and has an essentially constant thickness, said thickness being small in relation to its length and width. In particular, the strip comprises superconductive material deposited on top of the first 104 and second 105 superconductive areas using a thin film deposition method. Examples of suitable thin film deposition methods are described later in this text. The use of a thin film deposition method, in contrast to wire bonding, provides inherent advantages such as the possibility of making the airbridge 112 relatively short and rigid and placing it very accurately in place on the superconducting chip.

A first end of the strip comprises a first planar end portion 201 attached to and parallel with the first superconductive area 104. Similarly, a second end of the strip comprises a second planar end portion 202 attached to and parallel with the second superconductive area 105. The strip comprises a middle portion 203 between the first 201 and second 202 planar end portions. The middle portion 203 forms a bend away from the plane defined by the surfaces of the first 104 and second 105 superconductive areas, leaving an empty space between the middle portion 203 and said plane. This empty space isolates or separates the airbridge 112 from the circuit element 111 located in the discontinuity that separates the first 104 and second 105 superconductive areas. Selecting the axes of a Cartesian coordinate system in the way shown in FIG. 2, said plane defined by the surfaces of the first 104 and second 105 superconductive areas is the xy-plane or at least parallel to it.

An airbridge formed like that in FIG. 2 has been found to exhibit many advantageous characteristics. It can be made structurally strong by making the thin film deposition method produce a sufficient thickness; the thickness d of the strip in the direction perpendicular to the plane defined by the surfaces of the first 104 and second 105 superconductive areas is preferably at least 1 micrometer. In the coordinate system shown in FIG. 2 said perpendicular direction is the z-direction. The strip-like form, with the bend in the middle portion 203, is reasonably resistant against any forces (such as gravity) that may cause the airbridge to collapse. The mechanical strength of the strip can be enhanced, if desired, by making it consist of a stack of different materials or heterostructures. The empty space under the middle portion 203 allows later disconnecting the airbridge 112 if needed, without damaging the circuit element 111 below.

Measurements made with airbridges like that shown in FIG. 2 have indicated, however, that some suboptimal performance may be encountered under some conditions. At least a part of such suboptimal performance may be traced to mechanical vibrations in the airbridge itself.

Figure 3:
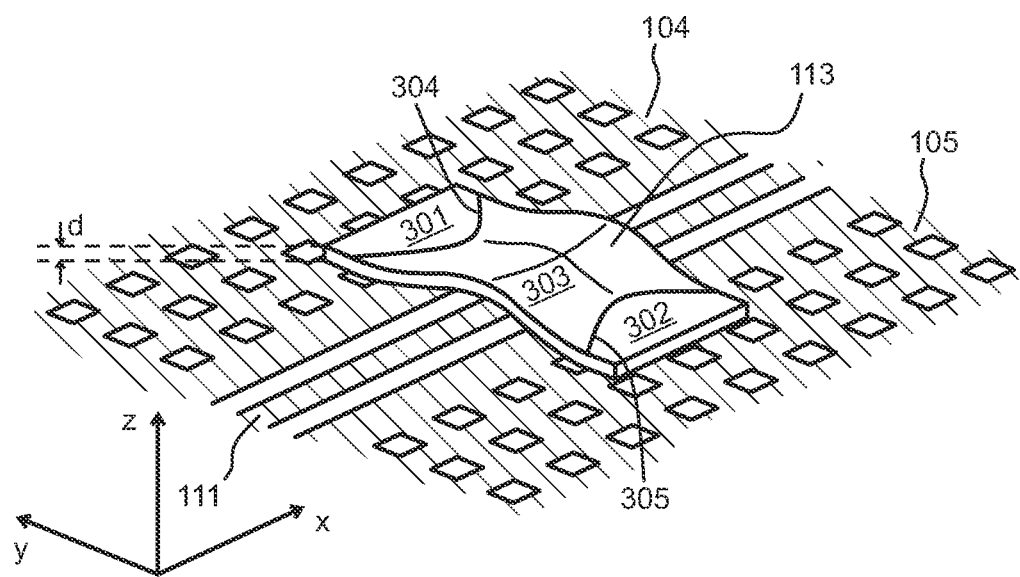
FIG. 3 illustrates an example embodiment of an airbridge.

FIG. 3 illustrates another embodiment of an airbridge 113 for making connections on a superconducting chip. Many parts in FIG. 3 are similar to the corresponding parts in FIG. 2, and marked with the same reference designators, so they do not need to be described again here. A first end of the strip that forms the airbridge 113 comprises a first planar end portion 301 attached to and parallel with the first superconductive area 104, and the second end comprises a second planar end portion 302 attached to and planar with the second superconductive area 105. The strip comprises a middle portion 303 between the first 301 and second 302 planar end portions. The middle portion 303 forms a bend away from the plane defined by the surfaces of the first 104 and second 105 superconductive areas, leaving an empty space between the middle portion 303 and said plane.

The difference compared to the embodiment of FIG. 2 relates to the way in which the portions 301, 302, and 303 of the strip are formed. A first separation line 304 separates the first planar end portion 301 from the middle portion 303. A second separation line 305 separates the second planar end portion 302 from the middle portion 303. At least one of the first 304 and second 305 separation lines is directed otherwise than just transversally across the strip. In the embodiment of FIG. 3 this applies to both separation lines 304 and 305: they both have a curved form that differs from the direct, transversal form that could be seen in the embodiment of FIG. 2.

Here, a line that would be directed transversally across the strip means a straight line that would be at a right angle against the longitudinal direction of the strip. A separation line that is directed otherwise than just transversally across the strip may be a curved, arced, or broken (zig-zagging) line (the ends of which may be at equal distances from the end of the strip). Additionally or alternatively a separation line that is directed otherwise than just transversally across the strip may be a direct line that is at a different angle than perpendicular against the longitudinal direction of the strip.

It has been found that forming the separation lines 304 and 305 this way causes the middle portion 303 to assume a form that is somewhat curved in two directions, as is graphically illustrated in FIG. 3. This appears to provide additional structural stability, so that the suboptimal performance mentioned above with reference to FIG. 2 can be largely avoided.

Figure 4:
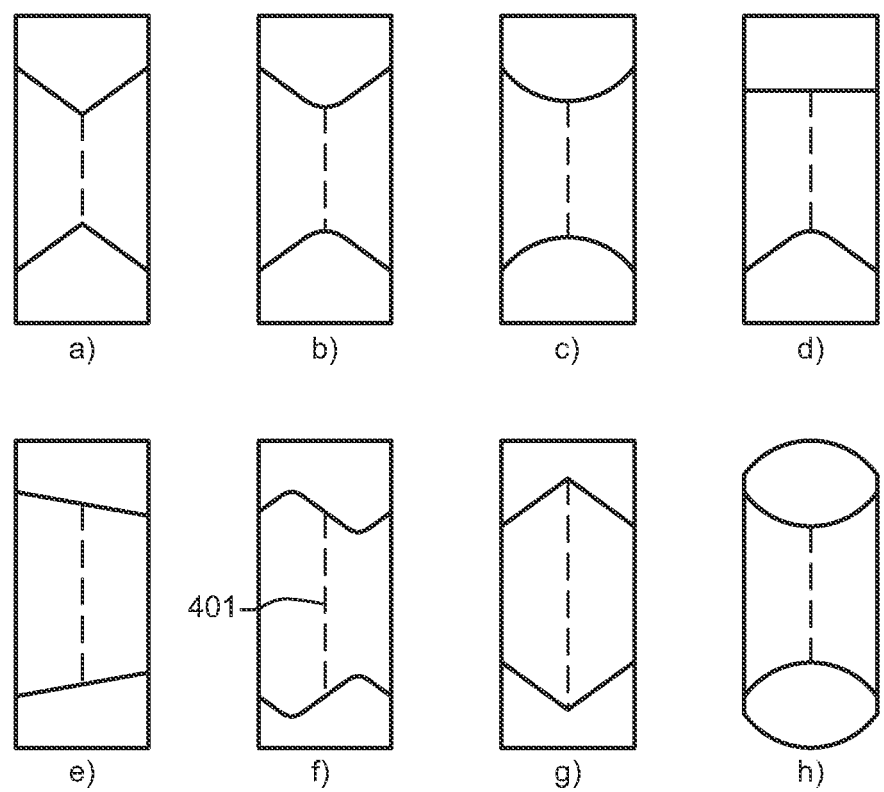
FIG. 4 illustrates examples of forms of airbridges.

FIG. 4 illustrates some possible forms of the separation lines that separate the end portions from the middle portion if the airbridge or strip. Each individual rectangle in FIG. 4 represents a top view of a strip-formed airbridge. In each case, the strip is limited by two longitudinal edges between its first end and second end. In most cases the length of the middle portion from the first separation line to the second separation line along a middle line (see dashed lines in FIG. 4) between the two longitudinal edges is different than the length of the middle portion along any of the two longitudinal edges. In case f) shown in FIG. 4, the length of the middle portion from the first separation line to the second separation line along the middle line 401 is the same as the length of the middle portion along both longitudinal edges, but there is significant variation in the length of the middle portion along any other line therebetween.

A feature common to the embodiment of FIG. 3 and to cases a), b), c), and h) of FIG. 4 is that the middle of each separation line reaches towards the other end. In other words, both ends of the first separation line are closer to the first end of the strip than a middle point of the first separation line, and both ends of the second separation line are closer to the second end of the strip than a middle point of the second separation line. It has been found that this way of forming the separation lines may make the middle portion assume the form of a saddle surface, as shown in FIG. 3. A saddle surface is one that exhibits curvature in two opposite directions along two different intersecting planes. For example, in FIG. 3 a cross section of the middle portion 303 in the xz-plane shows a curved form around the middle point of which was closest to the plane defined by the surfaces of the first 104 and second 105 superconductive areas. A cross section of the middle portion 303 in the yz-plane shows a curved form around the middle point of which was farthest from said plane.

Cases g) and h) show the middle of the first separation line closer to the first end of the strip than any of the ends of the first separation line, and the middle of the second separation line closer to the second end of the strip than any of the ends of the second separation line. This way of forming the separation lines tends to make the middle portion assume the form of a bubble, again exhibiting curvature in two directions, although in this case the perpendicular cross sections show similarly directed curvatures in both directions and not oppositely directed like in a saddle surface.

Case d) in FIG. 4 is an example of how one of the separation lines may be simply directed transversally across the strip, as long as the other separation line is not. This principle can be generalized to cover all possible forms of the other separation line, and not just that similar to case b) as in case d) of FIG. 4.

Case h) in FIG. 4 is a reminder that the ends of the strip do not need to be straight and/or perpendicular against the longitudinal direction of the strip. This principle can be generalized to strips with all kinds of separation lines, and not just those resembling case c) in FIG. 4.

Similar to FIG. 2, in the embodiment of FIG. 3, the thickness d of the strip in the z-direction is preferably at least 1 micrometer. It is possible to make the airbridge thinner, but at the expense of weakening structural stability. Other advantageous dimensions of the strip are found to be a length of the strip from its first end to its second end between 80 and 120 micrometers, these limits included, and a width of said strip in the transverse direction between 40 and 80 micrometers, these limits included.

Concerning the strip of superconductive material that constitutes the airbridge, it has been found advantageous to make the strip comprise at least two material layers on top of each other. According to an embodiment, said material layers are deposited with different thin film deposition methods. This and further aspects of producing an airbridge of the kind described above are considered next with reference to FIG. 5.

Figure 5:
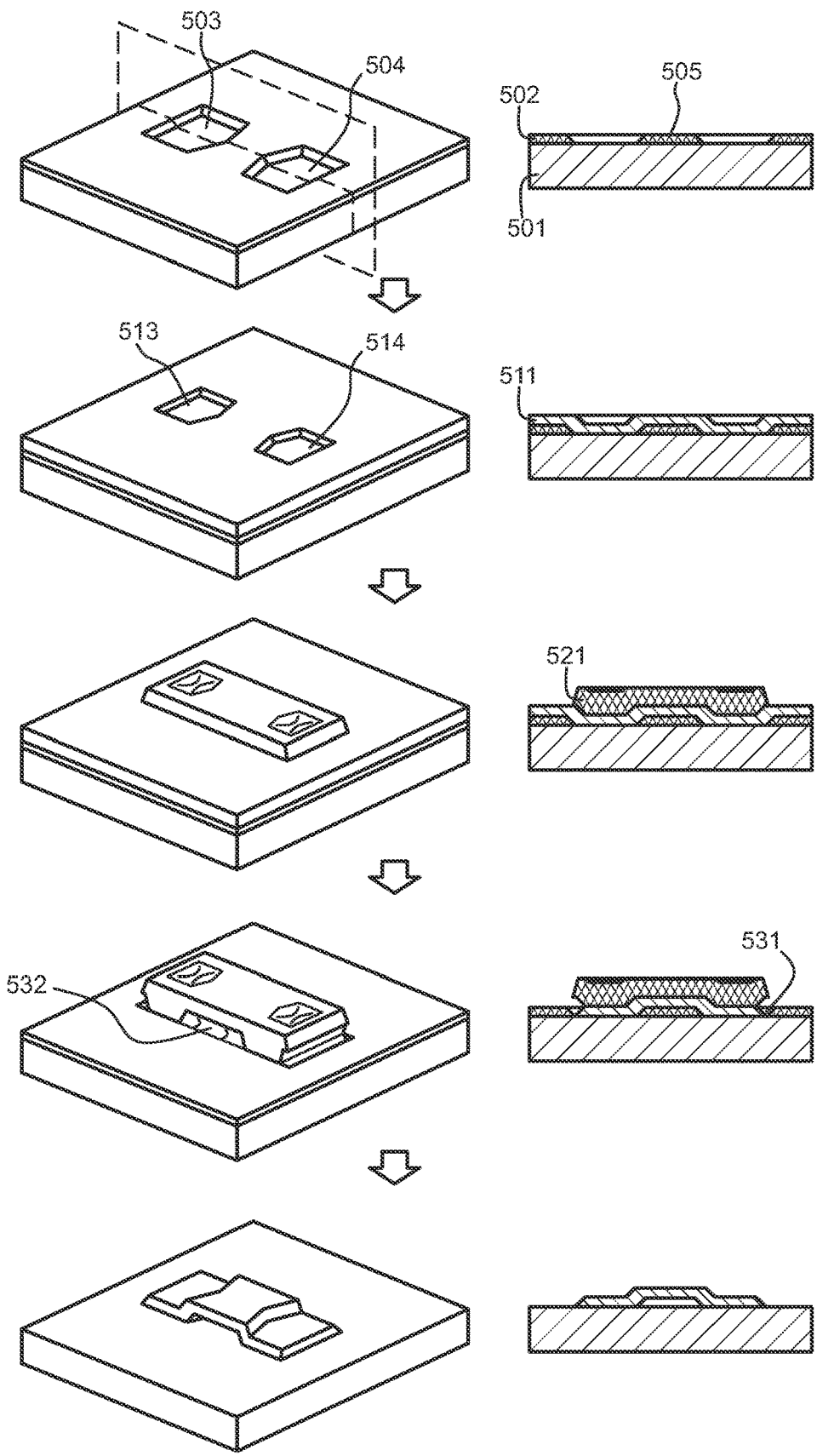
FIG. 5 illustrates a method of forming an airbridge.

FIG. 5 illustrates five main steps of a method for forming an airbridge. Concerning each step there is shown an axonometric view on the left and a cross section on the right. The imaginary plane drawn with dashed lines and intersecting the structure on the left in the top step of FIG. 5 illustrates the plane in which the cross section on the right is taken.

The first step shown in FIG. 5 comprises providing a substrate 501 and covering its surface with a patterned photoresist 502. Here, as in all other embodiments, the substrate 501 can be of any suitable material used as the structural support layer of superconducting chips. Examples of substrate materials include but are not limited to silicon, gallium arsenide, and sapphire.

The surface that is covered with the photoresist 502 comprises thereon the first and second superconductive areas that are to be connected with the airbridge, but these are not separately shown in FIG. 5. The patterns in the photoresist comprise two openings 503 and 504 at the locations where the first and second planar end portions of the strip are to be located in the completed airbridge. A piece of photoresist 505 is left intact between the openings 503 and 504: this piece of photoresist will eventually define the empty space under the middle portion of the airbridge.

The first step in FIG. 5 shows how those edges of the openings 503 and 504 that face each other are not straight, or at least do not follow a direct transverse path across the imaginary straight line connecting the center points of the two openings. In this embodiment both of said edges have the shape of a wide V, with the middle corners of the V's facing each other. This method step has an important impact on defining the form of the separating lines between the planar end portions and the middle portion of the strip, because said separating lines will follow the course of these edges of the openings.

The drawings involve a certain simplification, in which all material layers are limited by strictly planar facets: in reality, forming the openings 503 and 504 in the photoresist so that the middle points of their mutually facing edges are close to each other tends to make the piece 505 of intact photoresist between the openings somewhat thinner at its narrowest part. This will contribute to forming an airbridge, the middle portion of which has the form of a saddle surface.

The second step shown in FIG. 5 comprises using one or more thin film deposition methods to deposit a material layer 511, part of which will eventually form the strip of superconductive material, on top of the patterned photoresist. Many thin film deposition methods involve the inherent capability of producing a conformal material layer of essentially uniform thickness across all geometric forms of the underlying substrate. This is schematically shown in the cross section on the right in the second step of FIG. 5. Also in the axonometric drawing it may be noted how recesses 513 and 514 appear on the visible surface of the material layer 511 at the locations of the openings 503 and 504 in the underlaying patterned photoresist.

It is possible to produce the whole material layer 511 with a single thin film deposition method. However, it has been found advantageous at least in some cases to utilize several, different thin film deposition methods. Sputtering is advantageous as one such method because it may involve an advantageously fast growth rate of the thickness of the deposited material layer.

In an advantageous embodiment, the second step shown in FIG. 5 comprises removing oxide from surfaces of the first and second superconductive area at locations at which the strip of superconductive material is to be attached to the first and second superconductive areas. These locations are visible and accessible through the openings 503 and 504 in the photoresist 502. After that a first thin film deposition method is used to deposit a first layer of material at said locations. The removing of oxide may be performed in-situ in a vacuum environment. In order to prevent any further oxide from forming, it is advantageous to use said first thin film deposition method to deposit said first layer of material at said locations without compromising the vacuum of said vacuum environment in between. As an alternative, ex-situ methods such as chemical etching with hydrofluoric acid can be used to remove the oxide, followed by quick loading of the substrate into a protective environment such as vacuum.

One advantageous method of removing the oxide is ion milling, and one advantageous method of depositing the first layer of material at said locations is electron beam evaporation. Said first layer of material may consist of e.g. aluminum, and its thickness may be relatively small in comparison with the final thickness of the completed strip. Using electron beam evaporation, for example, a 20 nanometers thick layer of aluminum may be deposited as the first layer.

A second, different thin film deposition method may be used to deposit a second layer of material on top of the first layer. What methods and materials are selected may depend on what kind of thin film deposition systems are available and what features they possess. One of the materials may have e.g. good superconducting properties, while another of the materials may have good structural strength or be available for deposition with a method that is fast to grow the layer thickness to the desired range of about 1 micrometer. As explained previously, thinner (or thicker) material layers may be used to make the airbridge, depending on e.g. the properties of the materials involved and their interactions in the composite structure.

The third step shown in FIG. 5 comprises producing another layer of patterned photoresist 521. This time only that part of the material layer(s) 511 deposited in the previous step is covered with the photoresist 521 that is to constitute the strip-formed airbridge.

In the fourth step shown in FIG. 5 that part of the material layer(s) 511 is removed that was not covered by the latest photoresist 521. The latest photoresist 521 protects the strip-formed part of the material layer(s) 511 that is to constitute the airbridge. At the ends and sides of the photoresist 521 some cavity forming may occur, shown as 531 and 532, but mostly the photoresist 521 protects the part of the material layer(s) 511 under it.

Finally, all remaining photoresist is removed. This last step removes not only the protective photoresist 521 on top of the strip but also the portion 505 of the first photoresist that still remained below the middle portion, leaving the structure shown in the last step of FIG. 5.

Figure 6:
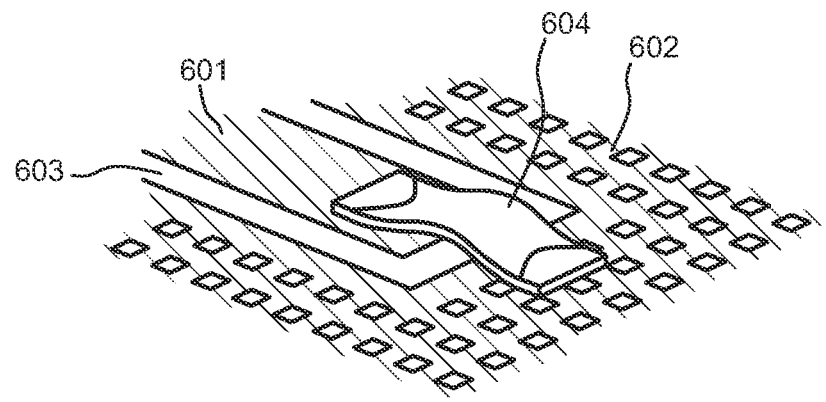
FIG. 6 illustrates an example embodiment of an airbridge.
Figure 7:
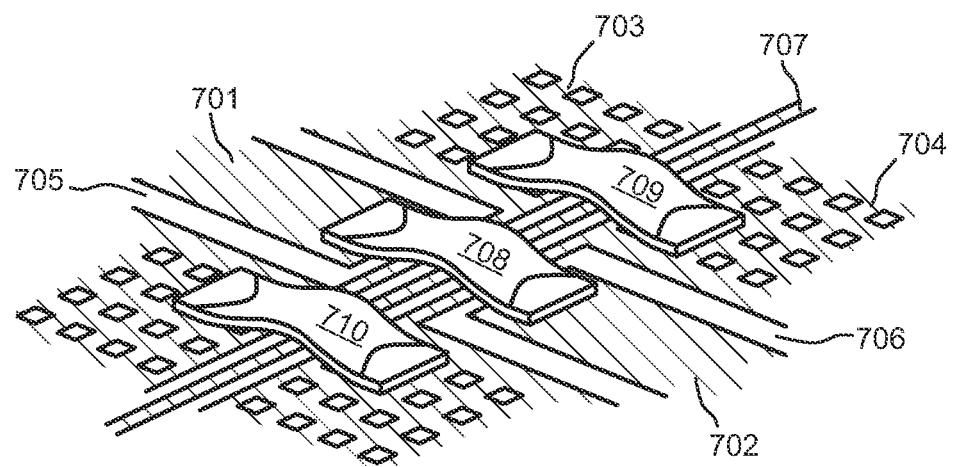
FIG. 7 illustrates an example embodiment of airbridges.

FIGS. 6 and 7 show further examples of how airbridges can be used in a superconducting chip. In the example of FIG. 6 the superconducting chip comprises a substrate and, on a surface thereof, a first, line-formed superconductive area 601, one end of which is seen in FIG. 6. The line-formed superconductive area 601 may be, for example, a resonator or a part of a signal-conducting transmission line. The end of the first superconductive area 601 is surrounded by a ground plane 602 in the form of a second superconductive area on the surface of the substrate. It is separated from the first superconductive area by a discontinuity 603. An airbridge 604 is provided between the end of the first superconductive area 601 and the ground plane 602, bridging the discontinuity 603. This is an example of how it is not in any way essential that an airbridge would only be used to connect two superconductive areas that are separated from each other by some actual circuit element located in the discontinuity. The airbridge 604 can be of any of the kinds that have been described above.

FIG. 7 illustrates a part of a superconducting chip that comprises a substrate and, on the surface thereof, a first line-formed superconductive area 701. Similar to FIG. 6 the first line-formed superconductive area 701 may constitute, for example, a resonator or a part of a signal-conducting transmission line. There is a second line-formed superconductive area 702 that too may be, for example, a resonator or a part of a signal-conducting transmission line. Each of these two superconductive areas is surrounded by a U-shaped section of a respective ground plane 703 or 704. Discontinuities 705 and 706 separate the first superconductive area 701 from the first U-shaped ground plane section 703 and the second superconductive area 702 from the second U-shaped ground plane section 704 respectively. A further line-formed superconductive area 707 runs in the linear discontinuity that separates the U-shaped ground plane sections 703 and 704 from each other. The further line-formed superconductive area 707 may be, for example, a resonator or a part of a signal-conducting transmission line.

A first airbridge 708 between the first 701 and second 702 superconductive areas connects these to each other across the separating discontinuity—in which are the connecting sections of the U-shaped ground plane sections 703 and 704 as well as the further line-formed superconductive area 707. Two other airbridges 709 and 710 between the U-shaped ground plane sections 703 and 704 connect these together across the discontinuity in which the further line-formed superconductive area 707 is located.

It is obvious to a person skilled in the art that with the advancement of technology, the basic idea of the invention may be implemented in various ways. The invention and its embodiments are thus not limited to the examples described above, instead they may vary within the scope of the claims.

The invention is claimed as follows:

1. An airbridge for making connections on a superconducting chip, wherein:
    the airbridge comprises a strip of superconductive material between a first superconductive area and a second superconductive area separated from said first superconductive area by a discontinuity,
    a first end of said strip comprises a first planar end portion attached to and parallel with said first superconductive area,
    a second end of said strip comprises a second planar end portion attached to and parallel with said second superconductive area, said strip comprises a middle portion between said first and second planar end portions,
said middle portion forms a bend away from a plane defined by the surfaces of the first and second superconductive areas, leaving an empty space between said middle portion and said plane,
a first separation line defines a boundary between the first planar end portion and the middle portion, and
a second separation line defines a boundary between the second planar end portion and the middle portion, and
wherein at least one of:
  a shortest distance between at least one end of the first separation line and the first end of the strip is less than a shortest distance between a middle point of the first separation line and the first end of the strip, or
  a shortest distance between at least one end of the second separation line and the second end of the strip is less than a shortest distance between a middle point of the second separation line and the second end of the strip.

2. The airbridge according to claim 1, wherein:
the strip is limited by two longitudinal edges between said first end and said second end; and
a length of said middle portion from said first separation line to said second separation line along a middle line between said two longitudinal edges is different than the length of said middle portion along any of the two longitudinal edges.

3. The airbridge according to claim 2, wherein:
both ends of the first separation line are closer to the first end of the strip than the middle point of the first separation line; and
both ends of the second separation line are closer to the second end of the strip than the middle point of the second separation line,
so that the length of said middle portion from said first separation line to said second separation line along said middle line between said two longitudinal edges is shorter than the length of said middle portion along any of the two longitudinal edges.

4. The airbridge according to claim 1, wherein the strip of superconductive material comprises at least two material layers on top of each other, wherein said material layers have been deposited with different thin film deposition methods.

5. The airbridge according to claim 1, wherein said middle portion has the form of a saddle surface.

6. The airbridge according to claim 1, wherein the thickness of said strip in the direction perpendicular to said plane is at least 1 micrometer.

7. The airbridge according to claim 1, wherein a length of said strip from said first end to said second end is between 80 and 120 micrometers, these limits included.

8. The airbridge according to claim 1, wherein a width of said strip in the transverse direction is between 40 and 80 micrometers, these limits included.

9. A superconducting chip, comprising:
a substrate;
on a surface of said substrate, a first superconductive area and a second superconductive area separated from said first superconductive area by a discontinuity; and
an airbridge between said first superconductive area and said second superconductive area,
wherein:
the airbridge comprises a strip of superconductive material between said first superconductive area and said second superconductive area,
a first end of said strip comprises a first planar end portion attached to and parallel with said first superconductive area,
a second end of said strip comprises a second planar end portion attached to and parallel with said second superconductive area,
said strip comprises a middle portion between said first and second planar end portions,
said middle portion forms a bend away from a plane defined by the surfaces of the first and second superconductive areas, leaving an empty space between said middle portion and said plane,
a first separation line defines a boundary between the first planar end portion and the middle portion, and
a second separation line defines a boundary between the second planar end portion and the middle portion, and
wherein at least one of:
  a shortest distance between at least one end of the first separation line and the first end of the strip is less than a shortest distance between a middle point of the first separation line and the first end of the strip, or
  a shortest distance between at least one end of the second separation line and the second end of the strip is less than a shortest distance between a middle point of the second separation line and the second end of the strip.

10. The superconducting chip according to claim 9, further comprising a circuit element located in said discontinuity between said first and second superconductive areas, wherein said circuit element is one of: a transmission line between further circuit elements, a resonator, a DC flux line, a DC voltage bias line, an RF line such as control bus, or a capacitive coupler line.

11. A method for producing a superconductive connection across a discontinuity between a first superconductive area and a second superconductive area of a superconducting chip, the method comprising using one or more thin film deposition methods to form a strip of superconductive material on top of said first and second superconductive areas and across said discontinuity, so that:
a first end of said strip is made to comprise a first planar end portion attached to and parallel with said first superconductive area;
a second end of said strip is made to comprise a second planar end portion attached to and parallel with said second superconductive area;
said strip is made to comprise a middle portion between said first and second planar end portions;
said middle portion is made to form a bend away from a plane defined by the surfaces of the first and second superconductive areas, leaving an empty space between said middle portion and said plane; and
at least one of said first and second planar end portions is formed so that a respective separation line that defines a boundary between the respective planar end portion and the middle portion includes at least one end such that a shortest distance between the at least one end and the respective end of the strip is less than a shortest distance between a middle point of the separation line and the respective end of the strip.

12. The method according to claim 11, wherein one of said one or more thin film deposition methods is sputtering.

13. The method according to claim 11, further comprising the steps of:

removing oxide from surfaces of said first and second superconductive area at locations at which said strip is to be attached to said first and second superconductive areas respectively; and using a first thin film deposition method to deposit a first layer of material at said locations, wherein said removing of oxide is performed in-situ in a vacuum environment, and wherein said use of the first thin film deposition method to deposit said first layer of material at said locations is performed without compromising the vacuum of said vacuum environment.

14. The method according to claim 13, wherein said removing of the oxide is performed using ion milling, and said deposition of the first layer of material at said locations is performed using an electron beam evaporation.

15. The method according to claim 13, further comprising after said deposition of material at said locations using the first thin film deposition method, using a second, different thin film deposition method to deposit a second layer of material on top of the first layer.

16. The method according to claim 11, wherein at least one of said first and second planar end portions is formed so that the length of said middle portion from said first separation line to said second separation line along a middle line between longitudinal edges of the strip is different than the length of said middle portion along any of the two longitudinal edges.

17. An airbridge for making connections on a superconducting chip, wherein:
the airbridge comprises a strip of superconductive material between a first superconductive area and a second superconductive area separated from said first superconductive area by a discontinuity,
a first end of said strip comprises a first planar end portion attached to and parallel with said first superconductive area,
a second end of said strip comprises a second planar end portion attached to and parallel with said second superconductive area,
said strip comprises a middle portion between said first and second planar end portions,
said middle portion forms a bend away from a plane defined by the surfaces of the first and second superconductive areas, leaving an empty space between said middle portion and said plane,
a first separation line defines a boundary between the first planar end portion and the middle portion, and
a second separation line defines a boundary between the second planar end portion and the middle portion, and
wherein at least one of:
a shortest distance between a middle point of the first separation line and the first end of the strip is less than a shortest distance between at least one end of the first separation line and the first end of the strip, or
a shortest distance between a middle point of the second separation line and the second end of the strip is less than a shortest distance between at least one end of the second separation line and the second end of the strip.

18. The airbridge according to claim 17, wherein a length of said strip from said first end to said second end is between 80 and 120 micrometers, these limits included.

19. The airbridge according to claim 17, wherein a width of said strip in the transverse direction is between 40 and 80 micrometers, these limits included.

20. The airbridge according to claim 17, wherein the strip of superconductive material comprises at least two material layers on top of each other, wherein said material layers have been deposited with different thin film deposition methods.

* * * * *